United States Patent [19]

Laubacher et al.

[11] Patent Number: 5,759,625
[45] Date of Patent: Jun. 2, 1998

[54] FLUOROPOLYMER PROTECTANT LAYER FOR HIGH TEMPERATURE SUPERCONDUCTOR FILM AND PHOTO-DEFINITION THEREOF

[75] Inventors: Daniel Bruce Laubacher, Wilmington, Del.; Philip Shek Wah Pang, Media, Pa.

[73] Assignee: E. I. du Pont de Nemours and Company, Wilmington, Del.

[21] Appl. No.: 675,128

[22] Filed: Jul. 3, 1996

Related U.S. Application Data

[60] Continuation-in-part of Ser. No. 434,093, May 3, 1995, abandoned, which is a division of Ser. No. 253,797, Jun. 3, 1994, abandoned.

[51] Int. Cl.$^6$ ........................................ B05D 3/06
[52] U.S. Cl. .................. 427/264; 427/539; 430/270.1; 430/313; 505/233
[58] Field of Search ............................ 505/233, 410, 505/728; 427/62, 535, 264; 430/539, 270.1, 313

[56] References Cited

U.S. PATENT DOCUMENTS

| | | | |
|---|---|---|---|
| 3,779,778 | 12/1973 | Smith et al. | 96/115 R |
| 5,077,174 | 12/1991 | Bauer et al. | 430/270 |
| 5,159,347 | 10/1992 | Osterwalder | 343/787 |
| 5,206,317 | 4/1993 | Hertler et al. | 526/220 |
| 5,324,713 | 6/1994 | Shen | 505/210 |
| 5,567,330 | 10/1996 | Dorothy | 216/18 |

FOREIGN PATENT DOCUMENTS

| | | | |
|---|---|---|---|
| 356130748 | 10/1981 | Japan. | |
| 2-192778 | 7/1990 | Japan. | |
| 4-196601 | 7/1992 | Japan | H01P 3/08 |

OTHER PUBLICATIONS

Thompson et al. ED, Materials for Microlithography, Radiation–Sensitive Polymers, *American Chemical Society*, ACS Symposium Series 266, 39–107, 1984.

Elliott, David J., Microlithography—Process Technology for IC Fabrication, *McGraw–Hill Book Company*, NY, 243–252, 1986.

Reichmanis, E. et al., Polymer Materials for Microlithography, *Chem. Rev.*, 89, 1273–1289, 1989.

Teflon AF, DuPont, 1989 and Jan. 1990 Update.

Jackson, C.M. et al, *Microwave & Optical Tech. Letts.*, 5(14), 722–726 (Dec. 20, 1992).

Nagai et al, Jpn. J. Appl. Phys. vol. 30, No. 11A, Nov. 1991, pp. 2751–2755.

Sato et al, Jpn. J. Appl. Phys. vol. 27, No. 11, Nov. 1988, pp. L2088–L2090.

*Primary Examiner*—Roy V. King

[57] ABSTRACT

Processes for patterning amorphous fluoropolymer Teflon®AF, passivating high temperature superconductor films, and improved electronic devices with amorphous fluoropolymer Teflon®AF films are disclosed.

5 Claims, No Drawings

FLUOROPOLYMER PROTECTANT LAYER FOR HIGH TEMPERATURE SUPERCONDUCTOR FILM AND PHOTO-DEFINITION THEREOF

CROSS-REFERENCE TO RELATED APPLICATIONS

This application is a continuation-in-part of U.S. application Ser. No. 08/434,093, filed May 3, 1995, now abandoned, which application, in turn, is a divisional of U.S. application Ser. No. 08/253,797 filed Jun. 3, 1994, now abandoned.

FIELD OF THE INVENTION

The present invention comprises methods and processes for patterning amorphous fluoropolymer Teflon®AF, and passivating high temperature superconductor films and devices with amorphous fluoropolymer Teflon®AF films.

BACKGROUND OF THE INVENTION

One of the deficiencies of some high temperature superconductors is their sensitivity to atmospheric moisture. Exposure of microwave and millimeter electronic devices containing superconducting materials to moisture usually results in performance degradation. Thus, means of passivation, or making the superconductor more inert to environmental factors is desired. Another problem for many superconducting devices is their large size, which is often dictated by power requirements. Thus, a means to increase the power of microwave and millimeter superconducting devices while maintaining a small size would provide numerous advantages in various applications. Copending application U.S. Ser. No. 07/788,063 filed Nov. 5, 1991, discloses a microwave dielectric resonator comprising a) a dielectric element positioned between two discrete high temperature superconducting thin films, each said film deposited on a substrate, and b) an outer enclosure having means for holding the resonator components and means for magnetic dipole coupling. A means to increase the power of such devices is desirable.

U.S. Pat. No. 5,159,347 discloses the use of amorphous fluoropolymer, Teflon®AF, in the construction of a micromagnetic circuit as an insulator between magnetic conductor strips and an electrical conductor. Use of such fluoropolymers in patterning films for microwave and millimeter devices has not been widespread. One of the desirable properties of a film of amorphous fluoropolymer is its essentially smooth, non-stick character. This is, however, viewed as a flaw if one is trying to cause a second material, i.e., a photoresist composition, to adhere to it. Imaging of the conventional photoresist over a fluoropolymer layer such as polymethyl methacrylate by deep UV followed by development leads to a photoresist mask over the fluoropolymer. This method suffers in two regards. First, an intermix layer may form due to the partial common solubility of the photoresist and the fluoropolymer. This leads to a lack of resolution during the subsequent etching of the fluoropolymer through the photoresist mask. Second, the patterned fluoropolymer is deficient to an amorphous fluoropolymer with respect to water resistance.

The present invention provides solutions to these various problems by providing a process for adhesion of and pattering of amorphous fluoropolymers such as Teflon®AF. This results in the further aspects of the present invention of a method of passivation for superconducting materials rendering them more inert to atmospheric moisture, and improved microwave and millimeter superconducting devices of increased power while retaining a small size.

SUMMARY OF THE INVENTION

This invention provides a process for producing patterned amorphous fluoropolymer films which comprises the steps of:

a) forming a continuous amorphous fluoropolymer film on a substrate;

b) exposing the surface of the amorphous fluoropolymer film to a low power, high purity oxygen plasma to promote adhesion, the oxygen plasma utilizing oxygen not less than 99% pure oxygen at less than 800 Watts power;

c) overcoating the adhesion promoted surface of the amorphous fluoropolymer film with a photoresist layer;

d) creating a latent image pattern in the photoresist layer by means of imagewise exposure to actinic radiation;

e) developing the imaged photoresist layer to create a patterned photoresist layer over the amorphous fluoropolymer film;

f) etching the amorphous fluoropolymer film through the patterned photoresist layer by reactive ion etching using greater than 99% pure oxygen or ion beam etching; and g) optionally, stripping the photoresist by organic solvents or by oxygen plasma etching.

DETAILED DESCRIPTION OF THE INVENTION

In known multilayer resist processes for patterning generally a photosensitive resist or photoresist is applied as a thin film to a substrate. The photoresist is then exposed in an image-wise fashion to light or radiation, for example through a mask. The mask contains clear and opaque features defining a pattern. The areas in the photoresist that are exposed are made either soluble or insoluble in a specific solvent termed a developer. Resists function by altering their solubility through radiation-induced chemical reactions. These reactions can either increase the solubility (positive tone) or decrease the solubility (negative tone) of the irradiated region. The terms positive and negative resists reflect this change in solubility. During development in the first case, the irradiated regions are dissolved by the developer leaving a positive image of the pattern in the resist and it is termed a positive resist. In the second case, the unirradiated regions are dissolved by the developer leaving a negative image of the pattern in the resist, and it is termed a negative resist. Following development the exposed substrate areas are etched through the patterned photoresist layer thereby replicating the pattern in the substrate. The photoresist layer is then optionally removed.

Known methods of providing an environmental protective layer over a film of high temperature superconductor comprise use of a layer of polymethyl methacrylate (PMMA) or polyimide. Neither material, though resistant to moisture, is as efficient as amorphous fluoropolymer film in this regard.

The present invention provides for use of an amorphous fluoropolymer film between the substrate and the photoresist layer. Such fluoropolymers provide a protective layer over the substrate and a method of passivation of devices incorporating the patterned substrate. Such amorphous fluoropolymers have not been used in known photoresist patterning processes because adhesion of the fluoropolymer to the substrate and the photoresist layer was a problem, and further because efficient techniques for etching such fluoropolymers without destroying the photoresist layer were not available.

By amorphous fluoropolymer film is meant a non-crystalline fluoropolymer or fluorocopolymer. Commercially available examples include a copolymer of 4,5-difluoro-2,2-bis(trifluoromethyl)1,3-dioxole and tetrafluoroethylene, (Teflon®AF) available from E. I. du Pont de Nemours and Company, Wilmington, Del. The thickness of the film employed is from 0.25 microns to 10 microns thick, preferably 0.5 to 3 microns.

The present invention provides a process for producing patterned amorphous fluoropolymer films comprising the steps of a) forming a continuous amorphous fluoropolymer film on a substrate; b) exposing the surface of the amorphous fluoropolymer film to an oxygen plasma to promote adhesion; c) overcoating the adhesion promoted surface of the amorphous fluoropolymer film with a photoresist layer; d) creating a latent image pattern in the photoresist layer by means of imagewise exposure to actinic radiation; e) developing the imaged photoresist layer to create a patterned photoresist layer over the amorphous fluoropolymer film; f) etching the amorphous fluoropolymer film through the patterned photoresist layer by reactive ion etching or ion beam etching; and g) optionally, stripping the photoresist by organic solvents or by oxygen plasma etching.

Substrates on which the patterning invention can be carried out include various types of substrates commonly used in electronic devices as well as various types of high temperature superconductors. The former include silicon, alumina ($Al_2O_3$), sapphire, gallium arsenide (GaAs) and indium phosphide (InP). Suitable superconductors are of many types and include YBaCuO, LaBaCuO, LaSrCuO, LaCaCuO, LaSrCaCuO, LaBaCaCuO, LaSrBaCuO, TlBaCaCuO, TlBaCuO, TlPbSrCaCuO, BiPbSrCaCuO, BiSrCaCuO, BiSrCuO, BiSrYCuO and others. Particularly preferred superconductors are YBaCuO (123), TlBaCaCuO (2212), TlBaCaCuO (2223), TlPbSrCaCuO (1212), TlPbSrCaCuO (1223), or BiSrCaCuO (2223). The high temperature superconductor may itself be on a support, for example, on lanthanum aluminate ($LaAlO_3$), yttrium stabilized zirconia, sapphire, quartz, magnesium oxide or strontium titanate.

Forming of the continuous amorphous fluoropolymer film on a substrate may be by methods known in the art for solution coating. These include knife coating, dip coating, roller coating, spray coating and spin coating. Preferred for use herein is spin coating.

It has been found that adhesion of the amorphous fluoropolymer can be promoted by subjecting the surface of the amorphous fluoropolymer film to a low power, high purity oxygen plasma formed in a barrel or planar-type RF Plasma reactor or in a reactive ion etching reactor. This treatment apparently serves to increase adhesion of a second material to the amorphous fluoropolymer film by causing a modification of the surface, perhaps by introducing a degree of roughness into the treated surface. Such a treated amorphous fluoropolymer surface will readily hold any of a number of commercial photoresist compositions.

When the substrate is a high temperature superconductor (HTS), it is important to not harm the superconductor properties of the substrate. Certain high powered methods for etching fluoropolymers are known to remove fluorine atoms from the fluoropolymer. Such mobilized fluorine atoms can destroy superconductor properties of HTS. Thus, it is important to use low power methods of less than 800, preferably less than 300 Watts power. Low power plasma generation means that the materials are exposed to lower processing temperatures and it is believed that this lower temperature is the reason for the improved results with low power plasmas.

For the preservation of superconductor properties, it is important to use essentially pure oxygen as the plasma gas. Contaminant gases, or on-purpose additive gases, such as ammonia may react in the oxygen plasma to form detrimental byproducts. Ammonia will lead to the formation of water which can destroy superconductor properties of HTS.

Photoresist requirements for microfabrication are similar, regardless of the exposure technology. The more important requirements include solubility, adhesion, etchant resistance, sensitivity and contrast (resolution). Since films are normally deposited on a substrate by spin-coating from solution, solubility in organic solvents is a necessary requirement. The resist must possess adequate adhesion to adhere to a variety of substrate materials and to withstand all processing steps. Poor adhesion leads to marked undercutting, loss of resolution and, in the worst case, complete destruction of the pattern. Pattern transfer to the underlying substrate has been conventionally accomplished using liquid etching techniques which require tenacious adhesion between resist and substrate in order to minimize undercutting and maintain edge acuity and feature size control. As geometries are reduced, liquid etching is being replaced by dry-etching techniques which place less stringent adhesion requirements on the resist. It should be noted however, that there still has to be sufficient adhesion to withstand development, and this becomes increasingly difficult as feature sizes decrease. Etchant resistance refers to the ability of the resist to withstand the etching environment during the pattern transfer process. The need to pattern fine features in thick substrates has led to the development of anisotropic etching methods such as reactive-ion etching, plasma etching, ion milling, and sputter etching. While not requiring a premium in terms of adhesion, these techniques place other very stringent requirements on the resist. Most dry-etching techniques rely on plasma-induced gas reactions in an environment of high radiation flux and temperatures in excess of 80° C.

Sensitivity is conventionally defined as the input incident energy (measured in terms of energy or the number of photons or particles (fluence) per unit area) required to attain a certain degree of chemical response in the resist that results, after development, in the desired relief image. This represents an operational, lithographic definition of sensitivity. Note that sensitivity increases as the dose required to produce the lithographic image decreases. The sensitivity of a positive resist is the dose required to effect complete solubility of the exposed region under conditions where the unexposed region remains completely insoluble. In the case of a negative resist, sensitivity is defined as the dose at which a lithographically useful image is formed. Clearly, the sensitivity of a resist should be commensurate with machine design parameters to allow optimization throughput. The pattern resolution attainable with a given resist for a particular set of processing conditions is determined in large part by the resist contrast ($\gamma$). Contrast in the case of a negative resist is related to the rate of cross-linked network (gel) formation and, for a positive resist, to both the rate of degradation and the rate of change of solubility with molecular weight with the latter being markedly solvent dependent. High contrast is important since it minimizes the deleterious effects due to scattering of radiation in the resist film. All exposure techniques result in some energy being deposited outside the primary image area. High contrast resists which do not respond significantly to low levels of scattered radiation are desirable.

Photoresists useable in this inventive process are many. They may be positive or negative working. Positive resists are preferred. They may be single component or two-component systems. Both chain scission resists and solution inhibit resists are suitable for use herein. Planarizing layers, antireflection coatings and contrast enhancement materials may also be employed with the photoresists. They may be sensitive to a wide variety of actinic radiation, ranging from deep UV to UV to visible to infrared. Also the radiation can vary to x-ray radiation or electron or ion beams. Many suitable commercial varieties are available. Preferred examples include Shipley 1400 and 1800 series resists, and KTI890 and AZ1400 series resists available from Shipley Co. Inc., 2300 Washington Street, Newton, Mass. 02162. Overcoating the amorphous fluoropolymer film with the resist layer may be by various techniques after the amorphous fluoropolymer is treated to promote adhesion as described above. Suitable techniques for overcoating include knife coating, dip coating, roller coating, spray coating or spin coating. Spin coating is preferred.

Optional baking (drying) steps may follow the application of both the amorphous fluoropolymer layer and the application of the photoresist layer.

Amorphous fluoropolymers exhibit limited solubility in only a few select solvents. Due to the lack of a common solvent for the amorphous fluoropolymer and photoresists, no intermix layer is formed during the application of the photoresist to the amorphous fluoropolymer layer. This leads to a high degree of resolution in the photoimaging/development process.

Photoimaging and development steps for multi layer resist processes suitable for use in the present invention are discussed in "Microlithography: Process Technology for IC Fabrication," D. J. Elliott, McGraw Hill Book Company, 243-252, Bowden, M. K., "Materials for Microlithography", Thompson et al. Eds., ACS Symposium Series 266, pp. 39-107, American Chemical Society, Washington, DC (1984); and Reichmanis, E., et al. Chem. Rev. 89, 1273-1289 (1989) each of which is herein incorporated by reference.

Imaging and developing of the commercial photoresist composition employed in the present invention can be by recommended procedures by the photoresist manufacturer. The developer may be an organic solvent, dilute aqueous acid or dilute aqueous base depending upon the photoresist employed. After a post development drying step, the patterned photoresist layer functions as a mask for patterning of the amorphous fluoropolymer layer. Because of the water sensitivity of high temperature superconductor substrates and because the substrate underlies the amorphous fluoropolymer film, non aqueous patterning methods are employed when such substrates are used.

It has been found that reactive ion etching or ion beam etching can be employed to etch the amorphous fluoropolymer. Reactive ion etching, using, preferably, greater than 99% pure oxygen, can be used to etch away the underlying amorphous fluoropolymer film at a rate much greater than the photoresist layer. Due to these differential etch rates between the photoresist and the amorphous fluoropolymer, the photoresist layer is not destroyed. The result of this process is a patterned, passivated area on the underlying substrate, preferably a high temperature superconductor film. The photoresist can optionally be removed by organic solvents or oxygen plasma etching.

The process of the present invention can be used to make materials useful as a) very thin film capacitors with extremely high breakdown potentials, and b) in the fabrication of multichip modules.

The use of amorphous fluoropolymer, patterned or not, in the construction of high temperature superconductor power carrying devices yields improvement in power carrying ability and resistance to moisture effects.

Devices of the prior art improvable by the patterning technology of the present invention include radiofrequency (RF) and microwave transmission line structures (microstrip, stripline or coplanar type), resonators, filters, delay lines, digital interconnects for integrated circuits, and MCM's (multi-chip modules).

EXAMPLES

Teflon®AF is a commercial product of E. I. du Pont de Nemours and Company, Wilmington, Del. comprising a copolymer of 4,5-difluoro-2,2-bis(trifluoromethyl)1,3-dioxole and tetrafluoroethylene. Two grades are available, Teflon®AF 1600 and 2400. Both are available as white powders that can be dissolved in certain perfluorinated solvents for the production of highly uniform thin films and coatings through spin coating and other techniques. For the examples that follow, Teflon®AF 1600 dissolved (6% by weight) in Fluorinert FC-75 solvent was employed.

Example 1

A structure in the Teflon®AF was fabricated in the following manner.

The films of Teflon®AF were patterned using a standard photolithographic process using Reactive Ion Etching (RIE). A photoresist etch mask was used to define the pattern on the Teflon®AF films. The process utilized began with coating the amorphous fluoropolymer film (Teflon®AF) on the surface of the substrate. The Teflon®AF utilized was a 1:1 solution of 6% F11-0201-1600 with FC-75 solvent. A 1.7 µm Teflon®AF film was spin coated on the samples at 3000 rpm for 30 sec. The Teflon®AF was post baked to drive off its solvent at 250° C. for 30 min. The post baked film of Teflon®AF was then exposed to a low power oxygen plasma for 2 min. in a MCS LF-5 plasma system. The plasma system was a conventional 13.56 MHz barrel etcher run at 250 W power and 450 mTorr pressure. The Teflon®AF was then coated with Shipley 1400-17 positive photoresist to a thickness of 0.5 micron. The resist was cured in air at 90° C. for 25 min. The 1400-17 was exposed to UV light in the range of 100 mJ per square centimeter. The 1400-17 was immersed in a 2:1 combination of Shipley MF312 developer to deionized water for 60 sec. The Teflon®AF was then etched down to the substrate by an oxygen RIE. The RIE system was a conventional 13.56 MHz, parallel plate reactor with the power applied to the bottom electrode (RIE mode). Samples were etched at a dc self-bias of 400 volts, a total gas flow rate of 15 sccm, substrate temperature of 30° C., and pressure of 20 mTorr. The chamber pressure was kept constant throughout the etching cycle by varying the pumping speed with an automatic throttle valve. This etching condition provided an anisotropic etch profile with extremely smooth sidewalls. The Teflon®AF films etched at a rate of 1 µm/min. The top resist masking the Teflon®AF film was removed with acetone.

Example 2

A structure in the Teflon®AF was fabricated in the following manner. The films of Teflon®AF were patterned using a standard photolithographic process using Reactive Ion Etching (RIE). A photoresist etch mask was used to define the pattern on the Teflon®AF films. The process utilized began with coating the amorphous fluoropolymer film (Teflon®AF) on the surface of the substrate. The Teflon®AF utilized was a 3:1 solution of 6% F11-0201-1600 with FC-75 solvent. A 2.5 μm Teflon®AF film was spin coated on the samples at 2000 rpm for 30 sec. The Teflon®AF was post baked to drive off its solvent at 250° C. for 30 min. The post baked film of Teflon®AF was then exposed to a low power plasma for 2 min. in a MCS LF-5 plasma system. The plasma system was a conventional 13.56 MHz barrel etcher run at 250 W power and 450 mTorr pressure. The Teflon®AF was then coated with Shipley 1400-17 positive photoresist to a thickness of 0.5 micron. The resist was cured in air at 90° C. for 25 min. The 1400-17 was exposed to UV light in the range of 100 mJ per square centimeter. The 1400-17 was immersed in a 2:1 combination of Shipley MF312 developer to deionized water for 60 sec. The Teflon®AF was then etched down to the substrate by an oxygen RIE. The RIE system was a conventional 13.56 MHz, parallel plate reactor with the power applied to the bottom electrode (RIE mode). Samples were etched at a dc self-bias of 400 volts, a total gas flow rate of 15 sccm, substrate temperature of 30° C., and pressure of 20 mTorr. The chamber pressure was kept constant throughout the etching cycle by varying the pumping speed with an automatic throttle valve. This etching condition provided an anisotropic etch profile with extremely smooth sidewalls. The Teflon®AF films etched at a rate of 1 μm/min. The top resist masking the Teflon®AF film was removed with acetone.

What is claimed is:

1. A process for producing patterned amorphous fluoropolymer films which comprises the steps of:
   a) forming a continuous amorphous fluoropolymer film on a substrate;
   b) exposing the surface of the amorphous fluoropolymer film to a low power, high purity oxygen plasma to promote adhesion, the oxygen plasma utilizing oxygen not less than 99% pure oxygen at less than 800 Watts power;
   c) overcoating the adhesion promoted surface of the amorphous fluoropolymer film with a photoresist layer;
   d) creating a latent image pattern in the photoresist layer by means of imagewise exposure to actinic radiation;
   e) developing the imaged photoresist layer to create a patterned photoresist layer over the amorphous fluoropolymer film;
   f) etching the amorphous fluoropolymer film through the patterned photoresist layer by reactive ion etching using greater than 99% pure oxygen or ion beam etching; and
   g) optionally, stripping the photoresist by organic solvents or by oxygen plasma etching.

2. The process of claim 1 wherein the amorphous fluoropolymer is a copolymer of 4,5-difluoro-2,2-bis (trifluoromethyl)-1,3-dioxole and tetrafluoroethylene.

3. The process of claim 1 wherein the substrate is a superconducting film selected from the group consisting of YBaCuO(123), TlBaCaCuO (2212), TlBaCaCuO (2223, TlPbSrCaCuO (1212), TlPbSrCaCuO (1223) and BiSrCaCuO(2223).

4. The process of claim 1 wherein the substrate is on a support selected from the group consisting of lanthanum aluminate, yttrium stabilized zuconia, sapphire, quartz, magnesium oxide and strontium titanate.

5. The process of claim 1 wherein the plasma is generated at less than 300 Watts power.

* * * * *